(12) United States Patent
Auzanneau et al.

(10) Patent No.: US 9,746,508 B2
(45) Date of Patent: Aug. 29, 2017

(54) METHOD OF MEASURING THE AGING OF ELECTRICAL CABLES

(71) Applicant: COMMISSARIAT A L'ENERGIE ATOMIQUE ET AUX ENERGIES ALTERNATIVES, Paris (FR)

(72) Inventors: Fabrice Auzanneau, Massy (FR); Lola Elsahmarany, Cachan (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 441 days.

(21) Appl. No.: 14/382,167

(22) PCT Filed: Feb. 13, 2013

(86) PCT No.: PCT/EP2013/052836
§ 371 (c)(1),
(2) Date: Aug. 29, 2014

(87) PCT Pub. No.: WO2013/127630
PCT Pub. Date: Sep. 6, 2013

(65) Prior Publication Data
US 2015/0025820 A1 Jan. 22, 2015

(30) Foreign Application Priority Data
Feb. 29, 2012 (FR) ..................... 12 51822

(51) Int. Cl.
*G01R 31/00* (2006.01)
*G01R 31/02* (2006.01)
*G01R 31/11* (2006.01)

(52) U.S. Cl.
CPC ............ *G01R 31/021* (2013.01); *G01R 31/11* (2013.01)

(58) Field of Classification Search
CPC .. G01R 31/11; G01R 31/021; H04B 10/0731; H04B 10/0799; H03H 11/126
See application file for complete search history.

(56) References Cited

U.S. PATENT DOCUMENTS

| 4,827,437 | A | * | 5/1989 | Blanton | ............... | G01R 35/005 |
| | | | | | | 702/89 |
| 8,847,606 | B2 | * | 9/2014 | White | ............... | G01R 31/021 |
| | | | | | | 324/541 |
| 2004/0183544 | A1 | | 9/2004 | Allan et al. | | |
| 2012/0203493 | A1 | * | 8/2012 | Dobson | ............... | H01B 7/0009 |
| | | | | | | 702/109 |

FOREIGN PATENT DOCUMENTS

GB 2456205 A 7/2009

* cited by examiner

*Primary Examiner* — Elias Desta
(74) *Attorney, Agent, or Firm* — Baker & Hostetler LLP

(57) ABSTRACT

A method may include injecting at an instant a reference signal at an injection point of the assembly, the reference signal having been obtained beforehand by injecting an initial signal at the injection point at an instant, by a measurement of the reflected signal resulting from this injection, and by the time reversal of the measured signal. The method may also include measuring a reflected signal resulting from the propagation of the signal in the assembly of at least one cable. The method may further include determining the aging of the assembly of at least one cable between the instant and the instant, the aging being deduced from the measurement of the reflected signal.

12 Claims, 7 Drawing Sheets

METHOD OF MEASURING THE AGING OF ELECTRICAL CABLES

CROSS-REFERENCE TO RELATED APPLICATIONS

This application is a National Stage of International patent application PCT/EP2013/052836, filed on Feb. 13, 2013, which claims priority to foreign French patent application No. FR 1251822, filed on Feb. 29, 2012, the disclosures of which are incorporated by reference in their entirety.

FIELD OF THE INVENTION

The invention relates to a method of measuring the aging of at least one electrical cable and applies notably to the fields of reflectometry and cable diagnosis.

BACKGROUND

Electrical cables are ubiquitous in all electrical systems, for power supply or data transmission. As a reminder, an electrical cable usually consists of two metal conductors that follow the same path. A cable may be isolated or placed within a strand. These cables are subject to the same stresses as the systems that they connect and may be subject to failures or slow degradation. In many applications, it is therefore necessary to be able to test the state of these cables and their level of aging.

By way of illustration, cables that run along railroad tracks convey signaling instructions for rail traffic. They are very important and their use is critical for the smooth operation of the rail network. A failure may have repercussions on a major part of the rail network and result in train stoppages or delays that may accumulate and cause other delays. These cables are usually long and are subject to the effects of bad weather, spraying or mechanical effects such as, for example, vibrations from passing trains or landslides. They then age rapidly despite protection such as metal ducting or elastomer sheaths.

In nuclear power plants, electrical cables are subjected to ionizing radiation that threatens both the insulators and the metal and in the long run cause degradation in signal transmission qualities and reduced ability to withstand an accident. Although they are subjected to radiation, these cables must be able to withstand accident conditions such as massive irradiation over a very short time in order to be able to continue to ensure their function. Indeed, this function may be critical as, for example, supporting control signals for ordering actions following an accident, such as the release of control rods for stopping chain reactions.

In all these examples, knowing the state of aging of the cable enables anticipating the replacement of cables that may no longer function normally.

The 'reflectometry method' is the most widespread and effective method for solving the problem of knowing the state of aging. This method uses a principle similar to that of radar. An electrical, often high frequency or broadband signal, is injected in one or more places on the cable being tested. This signal is propagated in the cable or the network and returns a portion of its energy when it encounters an electrical discontinuity. An electrical discontinuity corresponds, for example, to a branch connection, to the end of the cable or to a fault. Analysis of the signals returned to the injection point can be used to deduce information therefrom on the presence and location of these discontinuities and therefore of possible faults.

As commonly used, the reflectometry method is particularly suitable for detecting and locating a fault located at one or more points along a cable. In the case of overall aging of the cable, it does not provide any relevant information.

In the remainder of the description, the term aging refers to the modification of the electrical parameters or physical characteristics along a cable or an assembly of cables, either homogeneously or otherwise. The term fault refers to a localized modification of these parameters, i.e. in a relatively small area compared with the length of the cable.

SUMMARY OF THE INVENTION

One object of the invention is notably to overcome the aforementioned drawbacks.

Accordingly, the subject matter of the invention is a method of assessing the aging of an assembly of at least one electrical cable including:
- a step of injecting at an instant Tinj a reference signal Sar at an injection point of said assembly, said reference signal having been obtained beforehand by injecting an initial signal Sinit at the injection point at an instant Tinit, by a measurement of the reflected signal resulting from this injection, and by the time reversal of said measured signal;
- a step of measuring a reflected signal Smes resulting from the propagation of the signal Sar in the assembly of at least one cable;
- a step of determining the aging of the assembly of at least one cable between the instant Tinit and the instant Tinj, said aging being deduced from the measurement of the reflected signal Smes.

Aging is, for example, measured for a single cable, the initial signal and the reference signal being injected into this cable.

The aging of an assembly of at least two cables of a strand being estimated, the cables being distributed over at least two levels the wear of which progresses differently, the initial signal Sinit and the reference signal Sar are, for example, respectively injected into a first and into a second cable belonging to two distinct levels.

In one possible implementation, an asymmetry coefficient CA of the signal is determined, said coefficient being chosen so that it takes a value determined when the signal Smes is symmetrical with respect to a vertical straight line passing through its maximum and the value whereof deviates from this predetermined value when the signal Smes is not symmetrical, the level of aging of the cable being deduced from the value of the coefficient.

The asymmetry coefficient CA is, for example, equal to the ratio between the areas on each side of the vertical passing through the maximum of the signal Smes.

The asymmetry coefficient CA is, for example, a ratio between two lengths (d1, d2) associated with two straight line segments, the first straight line segment being defined by the intersection of a horizontal positioned at a height h of the amplitude axis (A) with a vertical passing through the maximum of the signal Smes and by a first intersection of said horizontal with the curve of the signal Smes, the second straight line segment being defined by the intersection of the horizontal with the vertical and by a second intersection of said horizontal with the curve of the signal Smes.

The asymmetry coefficient CA is, for example, calculated in this case by comparing the averages of the derivative obtained from the sides of the signal Smes located to the right and to the left of the vertical passing through the maximum of the curve Smes, between two ordinate values.

The asymmetry coefficient is, for example, determined by comparing the slopes of the signal Smes taken at a same height h' of the amplitude axis on each side of the vertical passing through the maximum of the signal Smes.

In a particular embodiment a first reflected signal Smes is measured on the basis of injecting an initial signal Sinit and a reference signal Sar at instant Tinit and Tinj close together so that the aging of the cable is not noticeable during this interval of time between these two samples, a second reflected signal Smes' is measured on the basis of injecting the same initial signal Sinit and a reference signal Sar' at close-together instant Tinit' and Tinj', the aging of the assembly of cables between the instant Tinj and Tinj' being deduced from the signal resulting from the difference between the signals Smes and Smes'.

The measurement of the reflected signal Smes results, for example, from the propagation of the signal Sar over several outward and return paths.

The subject matter of the invention is also a device for diagnosing the aging of an assembly of at least one cable implementing the method as previously described.

The subject matter of the invention is also a system of measuring the aging of an assembly of at least one cable including a diagnostic device as previously described a metal or ferromagnetic ring for creating a propagation discontinuity in the assembly of at least one cable the aging whereof must be estimated.

BRIEF DESCRIPTION OF THE DRAWINGS

Other features and advantages of the invention will become apparent from the following illustrative and non-restrictive description, with reference to the accompanying drawings in which.

DETAILED DESCRIPTION

Figure 1:
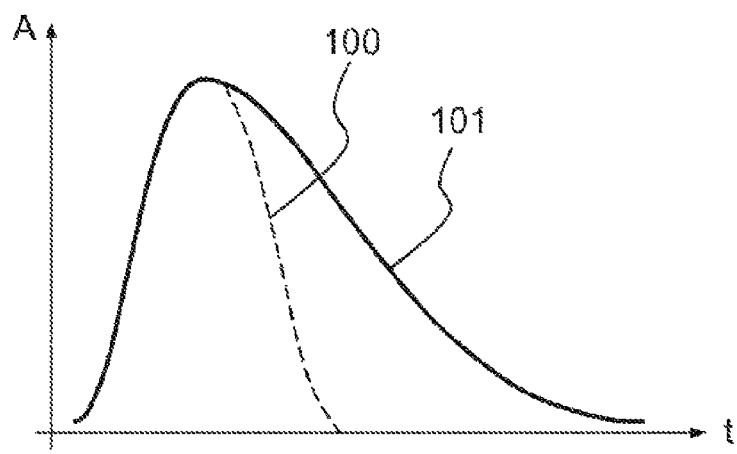
FIG. 1 gives an example of a reflectometry signal injected into a cable and a return signal.

FIG. 1 gives an example of a reflectometry signal injected into a cable and a return signal;

Conventional time domain reflectometry consists in injecting a given signal, e.g. a Gaussian or rectangular pulse, or a voltage step. The signals returned by the cable are then analyzed.

The principle of the method of measuring the aging of at least one electrical cable is described in detail below. A first reflectometry measurement is performed on a cable or an assembly of cables taken in a reference state. An example of reference state is when the cable is taken in a new or unaged state.

An initial signal Sinit is injected into the cable and the signal returned by the cable is stored. In the example in FIG. 1, this signal is a symmetrical Gaussian pulse 100. The signal returned 101 by the cable is not a simple copy of the injected signal Sinit. This is because it has been modified by its propagation in the cable owing to the phenomena of filtering, attenuation and dispersion. The cable has in a way set its signature on the returned signal.

The signal returned by the cable may be reused during the life of said cable for estimating its aging. Reusing the signal Sinit during the life of the cable would not provide accurate information on aging since the signal would be chosen a priori, i.e. without specific knowledge of the cable concerned. Advantageously, the use of the signal returned by the cable taken in a reference state following the injection of Sinit can be used to estimate the aging of the cable precisely.

Figure 2:
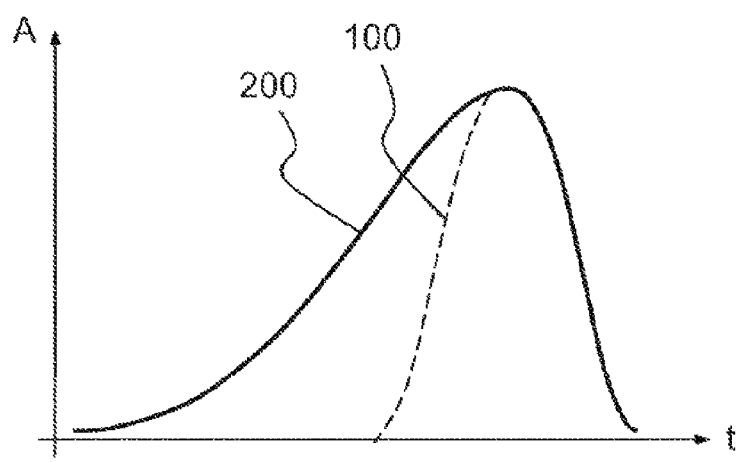
FIG. 2 illustrates the reversal of the signal returned by a cable taken in a reference state.

The signal returned by the cable in a reference status following the injection of Sinit is then time reversed so as to obtain a 'reference signal' denoted by Sar. FIG. 2 illustrates the reversal of the signal returned by the cable taken in a reference being. The signal Sar 200 can then be injected into the cable at different instant Tinj of the life of said cable.

Figure 3:
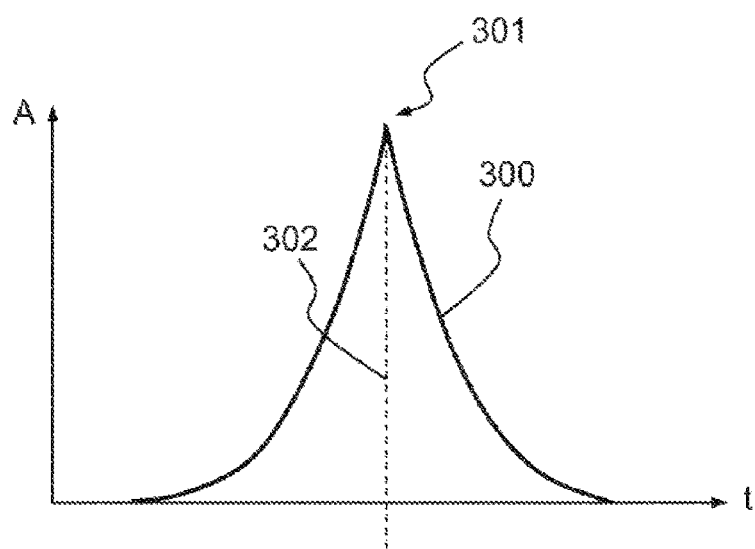
FIG. 3 gives an example of a measured signal in response to the injection of the signal Sar when the cable is in its reference state.

If the cable is still in its reference state, the signal that it returns 300 in response to the injection of the signal Sar is symmetrical with respect to a vertical axis passing through its maximum. FIG. 3 gives an example of measured signal 300 in response to the injection of the signal Sar when the cable is in its reference state. This signal is denoted by Smes.

On the other hand, an aging of the cable, leading to a modification of the electrical parameters of the cable, will cause a change in its response to the injection of the reversed adapted signal, which will cause a dissymmetry to appear in the signal Smes. A signal Smes will then be obtained resembling the first, the asymmetry whereof could, for example, be measured with respect to the vertical axis 302 passing through its maximum 301.

Figure 4:
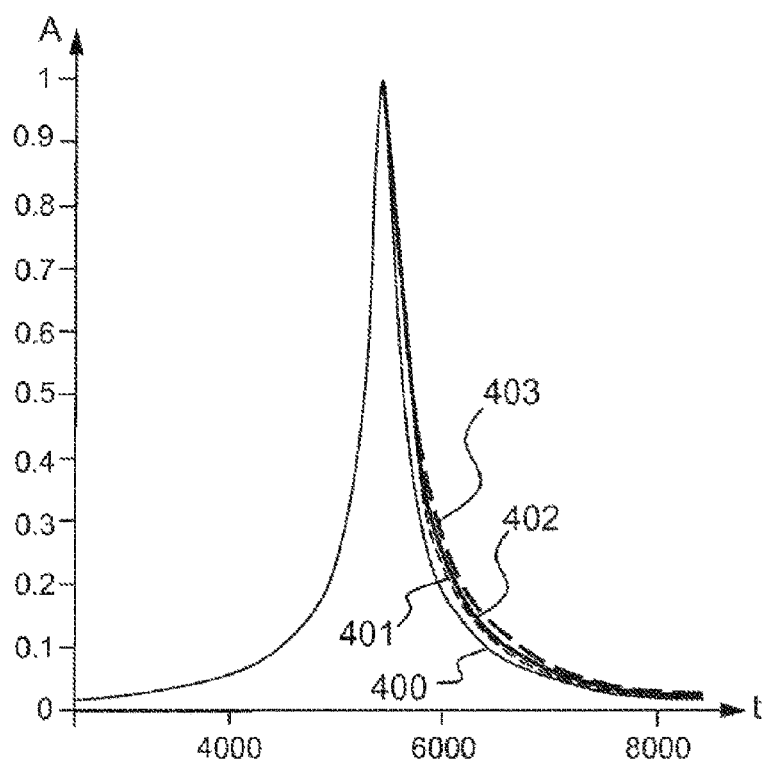
FIG. 4 illustrates the progress in asymmetry of the measured signal following the injection of the reversed adapted signal Sar for different levels of aging of a cable.

FIG. 4 illustrates the progress in asymmetry of the measured signal following the injection of the reversed adapted signal Sar for different levels of aging of a cable. The signal Smes is initially symmetrical 400 when the cable is new. Then it becomes increasingly skewed 401, 402, 403 when the cable ages.

In one embodiment, an asymmetry coefficient CA is determined so as to match the measurement of this coefficient to the aging of the cable. Within the context of an industrial use, it is then possible to perform measurements on several cables with several degrees of aging for linking asymmetry coefficient values to the age or degradation of the cable. As an alternative, a threshold above or below which it is considered that the cable can no longer fulfill its task may thus be determined.

In order to implement this method, it is possible to store the reversed adapted signal Sar in the measuring device used or in a remote server. It is also possible to store the signals Smes returned by the cable during its life. The method may be implemented on-board for continuous monitoring of the cable or externally by a system that connects onto the cable for measuring its aging during maintenance phases, for example.

Figure 5:
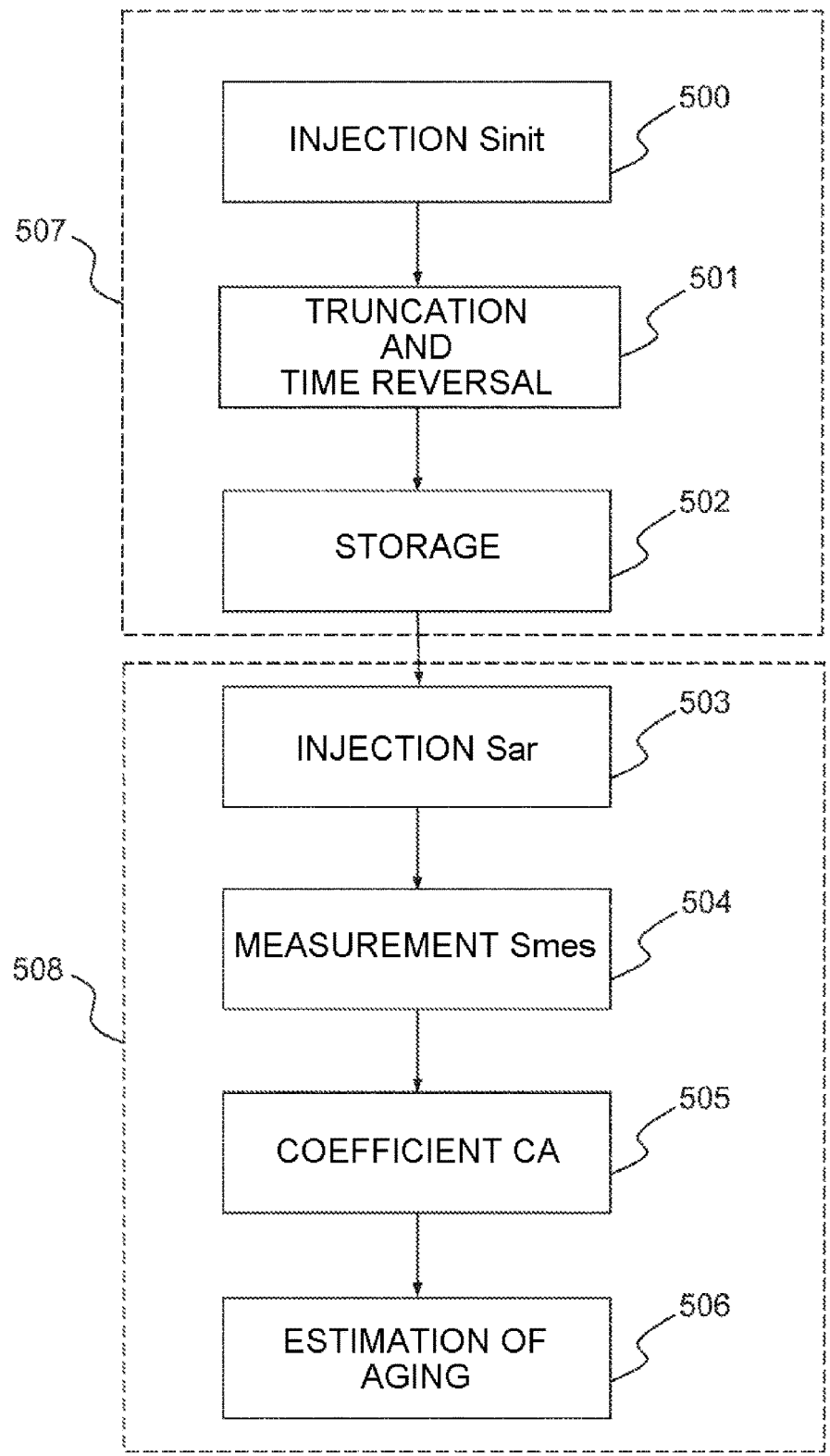
FIG. 5 schematically depicts the various steps of a method of measuring aging of an assembly of at least one cable.

FIG. 5 schematically depicts the various steps of the method of measuring aging of an assembly of at least one cable.

The method can be used to implement monitoring the aging of a cable continuously or iteratively over time, from a reference measurement of a reference signal, i.e. the reversed adapted signal Sar when the cable is in a reference state, e.g. when it is new. This reference may always be the same or updated at various times in the life of the cable. The first case is used for assessing a constant and gradual aging over time. The second case can be used to identify accelerated aging phases during the life of the cable.

The method includes a step 500 of measuring initial reflectometry. A symmetrical signal such as a Gaussian or rectangular pulse is injected at one end of the cable or assembly of cables called an injection point. The signal returned by the cable is then measured. This measurement is made with typical parameters of a standard reflectometry.

The signal reflected by this initial measurement is truncated and time reversed 501 then stored 502 to be reused later in the life of the cable. If it is very attenuated compared with the initial signal, it can be digitally amplified, or even filtered if it is noisy or normalized before storing it for future use. This new signal is the reversed adapted signal Sar.

In a subsequent step 503, the signal Sar thus obtained is injected at the same injection point at various times in the life of the cable for a new reflectometry measurement e.g. with the same instrument as in step 501.

A measurement Smes of the signal returned by the cable is acquired and stored 504. The pulse representative of the reflection at the end of the cable is isolated, then an asymmetry coefficient CA 505 is determined. The function of this coefficient is to assess the difference between the right and left portions of the signal Smes. This coefficient CA is calculated, for example, so that a symmetrical signal equates to one.

The steps 507 leading to the generation of the signal Sar and the steps 508 leading to the estimation of the aging of the cable are distinct steps that can be implemented separately, e.g. in two different devices.

The coefficient CA is then used for determining the aging of the cable. As an example, the value of the asymmetry coefficient is linked to the aging of the cable by a nomogram or by preliminary characterizations. When the cable is new, the coefficient CA is exactly one. If the coefficient exceeds a threshold value decided in advance as the maximum aging index, then it is time to change the cable.

In an alternative embodiment, the signal Sar used for acquiring Smes is not the same each time, but is the one that is obtained by applying time reversal to the signal measured during the previous measurement or a previously chosen measurement. In other words, the various signals Sar used correspond to several distinct reference states. The other steps are identical, with calculation of the asymmetry coefficient CA and detection of aging by analysis of the progress of the coefficient during the life of the cable. In this embodiment, the object is to detect an abrupt change in signs of accelerated aging caused by a sudden modification of the parameters of the cable since the previous reference measurement.

Figure 6:
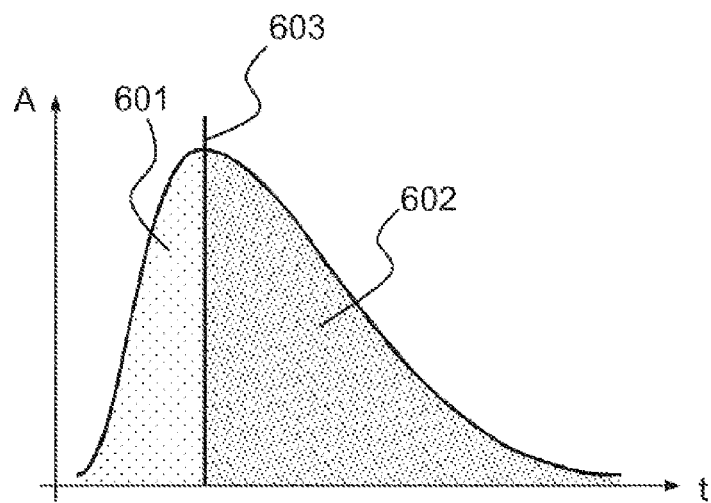
FIGS. 6 to 9 give four examples of methods for determining the asymmetry coefficient used by the method of measuring the aging of cables.

FIG. 6 gives a first example of a method for determining the asymmetry coefficient used by the method of measuring the aging of cables. This first method is based on determining the ratio between the areas 601, 602 on each side of the vertical 603 passing through the maximum of the signal Smes. If the ratio is other than one, an asymmetry is detected.

Figure 7:
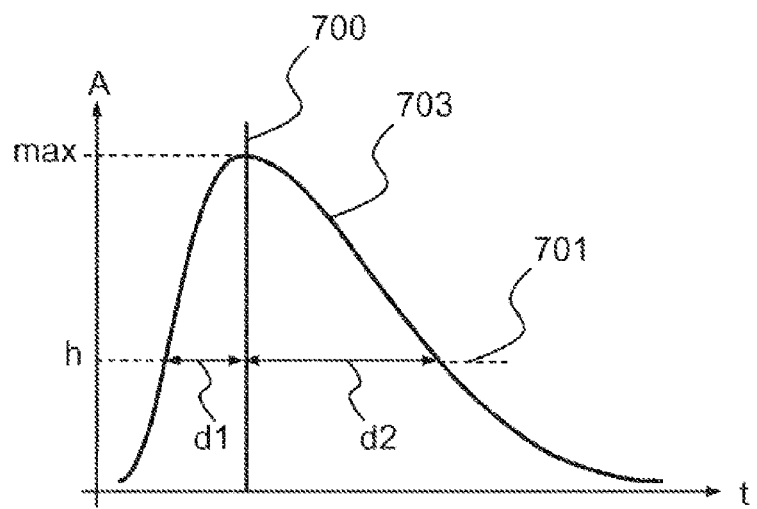

FIG. 7 gives a second example of a method for determining the asymmetry coefficient used by the method of measuring the aging of cables. In this case, the asymmetry coefficient corresponds to a ratio K between two lengths d1 and d2 associated with two segments. The first straight line segment is defined by the intersection of a horizontal 701 positioned at a height h of the amplitude axis A with a vertical 700 passing through the maximum of the signal Smes and by an intersection between the curve 703 of the signal Smes and said horizontal 701. The second straight line segment is defined by the intersection of the horizontal 701 with said vertical 700 and by a second intersection of said horizontal 701 with the curve 703 of the signal Smes.

Figure 8:
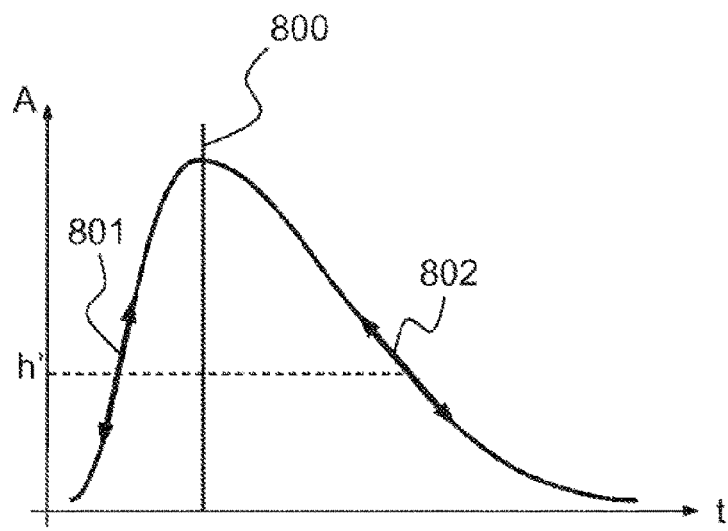

FIG. 8 gives a third example of a method for determining the asymmetry coefficient used by the method of measuring the aging of cables. The principle is to compare the slopes 801, 802 of the signal Smes taken at a same height h' on each side of the vertical 800 passing through the maximum of the signal Smes.

In this case, the coefficient CA can be chosen as being the difference or the ratio between the two slopes, according to whether it is wanted to compare it to one or to zero. This coefficient can be calculated at a given height h' with h'=max/2, for example, or else added or averaged over a range of given heights.

Figure 9:
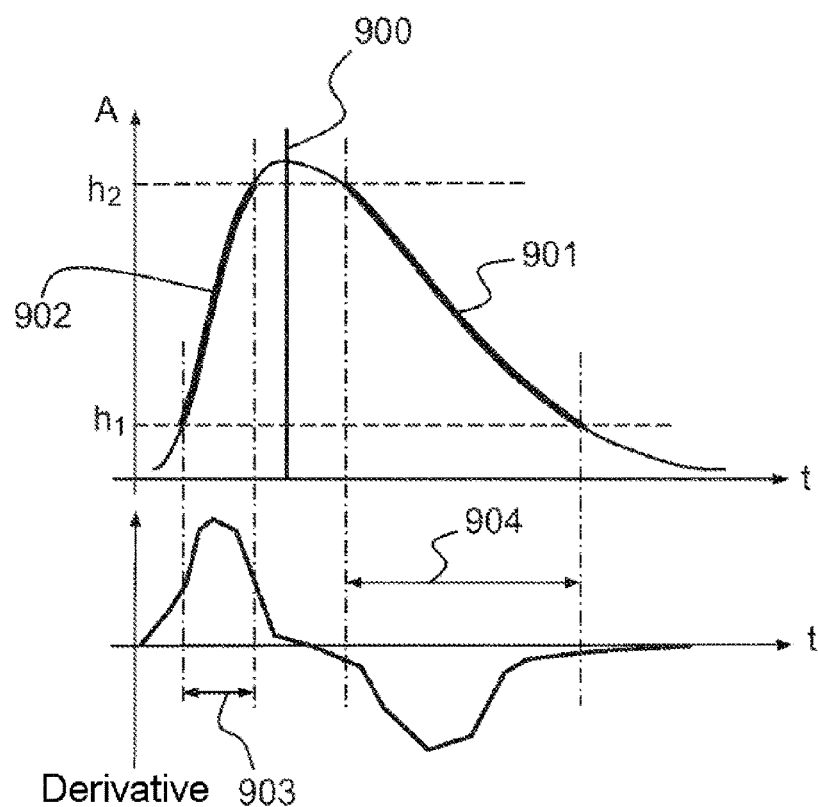

FIG. 9 gives a fourth example of a method for determining the asymmetry coefficient used by the method of measuring the aging of cables. The asymmetry coefficient CA is calculated in this case by comparing the averages 903, 904 of the derivative obtained from the sides of Smes located to the right 901 and to the left 902 of the vertical 900 passing through the maximum of the curve Smes, between two ordinate values.

Other methods of determining the asymmetry coefficient are also conceivable within the scope of the invention. In some applications, it may be necessary to define a coefficient adapted to the type of measured signal or injected signal for measuring initial reflectometry. One example of such a coefficient $\gamma_1$ is the coefficient usually designated by the term 'skewness' which can be defined by the following expression:

$$\gamma_1 = E\left[\left(\frac{X-\mu}{\sigma}\right)^3\right] = \frac{\mu_3}{\sigma^3} = \frac{E[(X-\mu)^3]}{(E[(X-\mu)^2])^{3/2}} = \frac{\kappa_3}{\kappa_2^{3/2}}, \quad (1)$$

in which:
X denotes the amplitude of the measured signal;
μ3 is the third centered moment defined by the expectation of X−μ cubed, μ being the mean of X;
σ is the standard deviation;
E [ ] denotes the mathematical expectation.
For a signal Smes sampled over n values, a coefficient $g_1$ can be determined using the following expression:

$$g_1 = \frac{m_3}{m_2^{3/2}} = \frac{\frac{1}{n}\sum_{i=1}^{n}(x_i - \bar{x})^3}{\left(\frac{1}{n}\sum_{i=1}^{n}(x_i - \bar{x})^2\right)^{3/2}}, \quad (2)$$

in which:
$x_i$ denotes the i-th sample of the signal Smes;
$\bar{x}$ denotes the sample mean $x_i$.

Although the implementations described above have been described for a symmetrical initial signal Sinit, the person skilled in the art may adapt the method for a non-symmetrical signal Sinit. In this case, the value of the coefficient CA should not be compared with predefined values using, for example, a nomogram, but the progress over time of this coefficient should be compared for several distinct measurements Smes and optionally they should be compared with one or more predefined values for determining a level of aging.

The method can be applied for measuring the aging of a point-to-point cable or of a branched cable. In the latter case, several pulses are returned following an injection of the signal Sar, said pulses being characteristic of the branches and terminations of the lines. The method can then be applied by choosing the section that is to be analyzed by selecting the pulse returned by the end of this section as a reference signal. It is then necessary to isolate the pulse of the signal Smes returned by this section and apply the method on this pulse only.

The method may be applied to a branched or unbranched cable, undergoing uniform aging. It may also be applied to a cable undergoing aging which is not uniform. In this case, the method is applied in the same way. As an example, it is possible for only twenty-five percent of a cable to remain almost new while the other seventy-five percent ages more rapidly. If the aging of the cable is not constant along its length, but, for example, a portion ages differently because the environmental conditions are different, the signal returned by the cable has asymmetry characteristics representative of the ratio between the new and aged portions. Analysis of the asymmetry of the signal in this case can be used to deduce therefrom the distribution of aging of the cable.

The method of measuring aging may be applied to an isolated wire or a strand, i.e. an assembly of several cables.

The cables of a strand may be distributed in different ways. The positions of the cables in the strand may be random and change along its length. In this case, aging is then identical for all the cables of the strand and the method of measuring aging previously described is applied to one of the cables for determining the aging of all the cables of the strand.

Alternatively, the relative positions of the cables in the strand may be identical anywhere on the strand. Two cases may then be distinguished: In a first case, all the cables of the strand are on the outside. In a second case, some of the cables are on the inside of the strand and others on the outside.

Figure 10A:
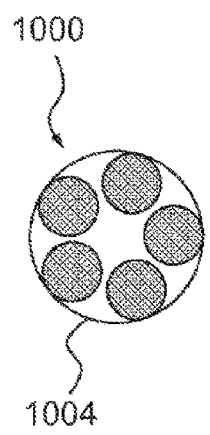
FIGS. 10a and 10b give two examples of strands.
Figure 10B:
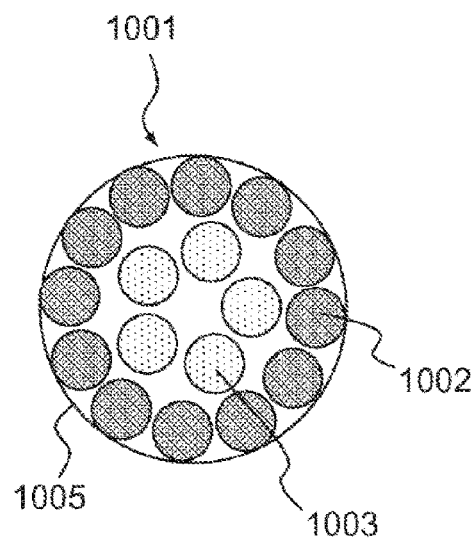

FIGS. 10a and 10b give two examples of strands. A first example of strand 1000 includes five cables and a second example of strand 1001 includes an outer level 1002 including twelve cables and an inner level 1003 includes five cables. The cables of the two strands of the 1000, 1001 are covered with an insulator 1004, 1005.

For strands composed of one outer level of cable and at least one inner level of cable, it is usual for the cables belonging to the inner level to be better protected from the outside environment than the cables of the outer level.

Figure 11:
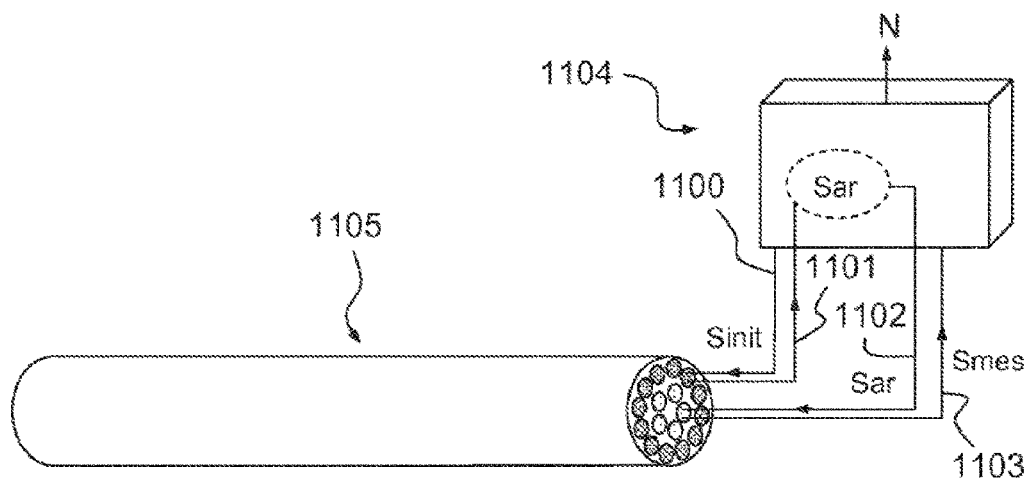
FIG. 11 gives an example of applying the method of measuring aging to a strand including several levels of cables.

FIG. 11 gives an example of applying the method of measuring aging to a strand including several levels of cables.

A first way of doing so is to apply the method independently to one or more cables. Another way of doing so is to apply the method differentially as shown in FIG. 11. For this, it is possible to compare aging between the inner and outer level cables using as a reference signal on an inner level cable the reversed adapted signal Sar of an outer cable. In one example of implementation, a diagnostic device 1104 injects 1100 into an outer level cable of a strand 1105 an initial signal Sinit, measures the signal returned 1101, deduces therefrom the signal Sar which is then injected 1102 into an inner level cable of the strand 1105. The reflected signal Smes is then collected 1103 and measured for estimating N the aging of the strand 1105. In this case, the injection point corresponds to the section of the strand at which the signals necessary for implementing the method are injected and measured.

It is also possible to compare the aging of the outer cables with that of the inner cables of the same strand by using as a reference signal on an outer cable the reversed adapted signal Sar obtained from an inner level cable.

It should be noted that when the diagnostic device is not impedance-matched to the cable being tested, the signal returning from the cable bounces back to the connection with the diagnostic device and sets off again in the cable. This is expressed in the measurement of the signal Sinit modified following its reflection in the cable by pulses additional to the main pulse returned. These pulses correspond to signals having traveled a greater distance equal to a whole multiple of the outward and return distance in the cable. Thus, in one embodiment, these additional signals may be used for shaping the reversed adapted signal Sar.

It is further known that the aging of a cable is expressed by a modification in the propagation speed of the signals. In general, this modification corresponds to a reduction in this speed. This information of modification of the propagation speed can then be used in parallel with the measurements obtained by the method previously described in order to refine the estimate of the aging of the cable. For this, an estimate of the relative time shift in the signals from the new cables with respect to the signals from the aged cables can be used.

Figure 12:
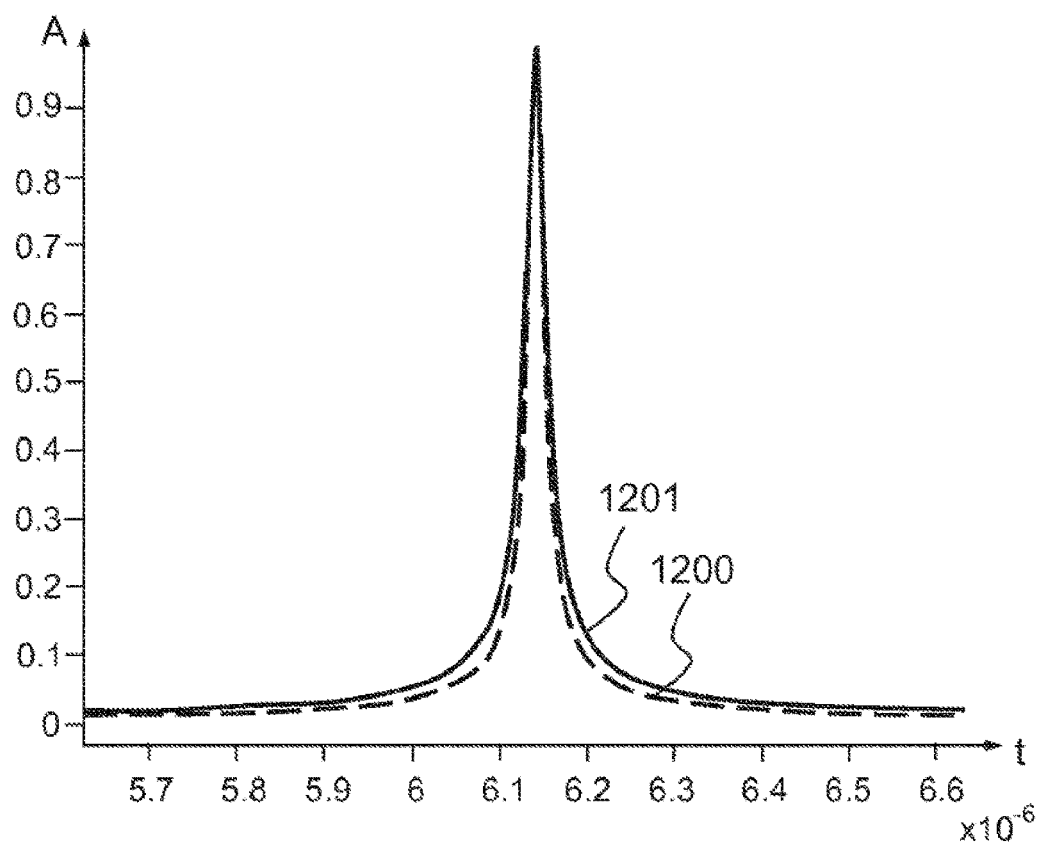
FIG. 12 illustrates the fact that two measured signals generated from two distinct reference signals can be used for estimating the aging of a cable.

Furthermore, the calculation of the asymmetry coefficient CA may be replaced by another technique. Referring to FIG. 12, the difference may be identified, for example, between the acquired signal 1200 Smes1 for the new cable after injection of the reversed adapted signal Sar with the signal Smes2 1201 obtained during the life of the cable. The maximums of these two signals can be calibrated at the same instant, by shifting one of the signals, for example, that of the aged cable, and identifying the difference between the two. A possible aging indicator is then the area under the curve of the absolute value of this difference.

It is well known that some cables have a strong absorption of high frequencies owing to their physical characteristics or their great length. The proposed method of measuring aging is then difficult to implement since the signal dispersion to be revealed is usually visible thanks to the high frequencies in the signal spectrum. One way to overcome this problem is to add a metal or ferromagnetic ring at a place around the cable the function of which is to create a propagation discontinuity in order to return a signal to the injection point. A smaller length of cable is thus simulated. This results in a lower attenuation of propagation. The application of the method of measuring aging remains unchanged.

In one embodiment, several outward and return paths can be used instead of just one. This has the effect of increasing the dissymmetry of the signal Smes between a new cable and a used cable.

It is also possible to apply the method to the new cable by injecting it with the signal Sinit in order to obtain a symmetrical reference signal Sar, then repeating the operation by injecting the signal Sinit into the aged cable which will provide a second symmetrical signal Sar'. Then the two signals obtained Smes and Smes' are compared, the difference being especially related to the maximum amplitude and the distance apart of the branches of the signal with respect to the axis of symmetry. If both of the signals Smes and Smes' are normalized so that the maximum is an arbitrary value of one, it is the difference in width which is the aging criterion.

The invention claimed is:

1. A method for measuring an aging of an assembly of at least one electrical cable, comprising:
   injecting, at an instant Tinj, a reference signal Sar at a first injection point of said assembly, wherein said reference signal Sar is obtained beforehand by injecting an initial signal Sinit at a second injection point of said assembly at a previous instant Tinit by a measurement of a first reflected signal resulting from the injection of said initial signal Sinit, and by a time reversal of said measured first reflected signal;
   measuring a second reflected signal Smes resulting from a propagation of the reference signal Sar in the assembly of at least one cable; and
   processing the second reflected signal Smes to determine the aging of the assembly of at least one cable between the previous instant Tinit and the instant Tinj based on the measurement of the second reflected signal Smes.

2. The method of claim 1, wherein the assembly of at least one electric cable comprises a single cable and the initial signal and the reference signal are injected into the single cable.

3. The method of claim 1, wherein the assembly of at least one electric cable comprises a strand having first and second cables, the first and second cables having different levels of wear progression, the first injection point being on the first cable and the second injection point being on the second cable.

4. The method of claim 1, further comprising:
   determining an asymmetry coefficient CA of the second reflected signal Smes,
   wherein said asymmetry coefficient CA corresponds to a first value when the second reflected signal Smes is symmetrical with respect to a vertical straight line passing through its maximum and a second value deviating from the first value when the second reflected signal Smes is not symmetrical, and
   wherein a level of aging of the cable is determined from the asymmetry coefficient CA.

5. The method of claim 4, wherein the asymmetry coefficient CA is equal to a ratio between areas of a curve of the second reflected signal Smes on each side of a vertical passing through a maximum of the curve.

6. The method of claim 4, wherein the asymmetry coefficient CA is a ratio between two lengths associated with first and second straight line segments, the first straight line segment being defined by an intersection of a horizontal positioned at a height h of an amplitude axis with a vertical passing through a maximum of the second reflected signal Smes and by a first intersection of said horizontal with a curve of the second reflected signal Smes, the second straight line segment being defined by the intersection of the horizontal with the vertical and by a second intersection of said horizontal with the curve of the second reflected signal Smes.

7. The method of claim 4, wherein the asymmetry coefficient CA is determined by comparing averages of a derivative obtained from sides of the second reflected signal Smes of the vertical passing through the maximum of a curve of the second reflected Smes, between two ordinate values.

8. The method of claim 4, wherein the asymmetry coefficient CA is determined by comparing slopes of the second reflected signal Smes taken at a same height h' of an amplitude axis on each side of the vertical passing through the maximum of the second reflected signal Smes.

9. The method of claim 1, wherein the instants Tinit and Tinj are close together so that the aging of the cable is not noticeable during an interval of time between the instants Tinit and Tinj, the method further comprising:
   measuring a third reflected signal Smes' based on the injecting the initial signal Sinit and a reference signal Sar' at close-together instants Tinit' and Tinj', the aging of the assembly of cables between the instants Tinj and Tinj' being obtained from the signal resulting from a difference between the second reflected signal Smes and the third reflected signal Smes'.

10. The method of claim 1, wherein the measurement of the second reflected signal Smes results from the propagation of the reference signal Sar on a plurality of outward and return paths.

11. A device for diagnosing an aging of an assembly of at least one cable, said device being configured to:
    inject, at an instant Tinj, a reference signal Sar at a first injection point of said assembly, wherein said reference signal is obtained beforehand by injecting an initial signal Sinit at a second injection point of said assembly at a previous instant Tinit by a measurement of a first reflected signal resulting from the injection of said initial signal Sinit and by a time reversal of said measured first reflected signal;
    measure a second reflected signal Smes resulting from a propagation of the reference signal Sar in the assembly of at least one cable; and
    process the second reflected signal Smes to determine the aging of the assembly of at least one cable between the previous instant Tinit and the instant Tinj based on the measurement of the second reflected signal Smes.

12. A system for measuring an aging of an assembly of at least one cable, the system comprising:
    a device configured to:
       inject, at an instant Tinj, a reference signal Sar at a first injection point of said assembly, wherein said reference signal is obtained beforehand by injecting an initial signal Sinit at a second injection point of said assembly at a previous instant Tinit by a measurement of a first reflected signal resulting from the injection of said initial signal Sinit and by a time reversal of said measured first reflected signal;
       measure a second reflected signal Smes resulting from a propagation of the reference signal Sar in the assembly of at least one cable; and
       process the second reflected signal Smes to determine the aging of the assembly of at least one cable between the previous instant Tinit and the instant Tinj based on the measurement of the second reflected signal Smes; and
    a metal or ferromagnetic ring for creating a propagation discontinuity in the assembly of at least one cable.

* * * * *